United States Patent
Weber et al.

(10) Patent No.: US 8,953,116 B2
(45) Date of Patent: Feb. 10, 2015

(54) MEDIA PLAYER WITH MACHINED WINDOW UNDERCUT AND TRANSPARENT WALL DISPOSED THEREIN

(75) Inventors: Douglas Joseph Weber, Arcadia, CA (US); Pinida Jan Moolsintong, San Francisco, CA (US); Stephen P. Zadesky, Portola Valley, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/475,567

(22) Filed: May 18, 2012

(65) Prior Publication Data

US 2012/0281344 A1 Nov. 8, 2012

Related U.S. Application Data

(60) Continuation of application No. 12/840,998, filed on Jul. 21, 2010, now Pat. No. 8,182,638, which is a division of application No. 11/519,285, filed on Sep. 11, 2006, now abandoned.

(51) Int. Cl.
*G02F 1/13* (2006.01)
*H04R 5/00* (2006.01)
*H04R 1/02* (2006.01)
*H05K 5/02* (2006.01)

(52) U.S. Cl.
CPC .. *H04R 5/00* (2013.01); *H04R 1/02* (2013.01); *H05K 5/0239* (2013.01)
USPC ........ 349/58; 206/701; 206/777; 361/679.01; 361/679.21; 361/679.4; 361/681

(58) Field of Classification Search
USPC ................ 206/701, 777; 349/58; 361/679.01, 361/679.21, 679.4, 681
See application file for complete search history.

(56) References Cited

U.S. PATENT DOCUMENTS

| | | | |
|---|---|---|---|
| 2,054,785 A | 9/1936 | Harris | |
| 4,991,331 A | 2/1991 | James | |
| 5,936,600 A | 8/1999 | Ohashi et al. | |
| 6,125,081 A * | 9/2000 | Flynn | 368/10 |
| 6,389,687 B1 * | 5/2002 | Glenn et al. | 29/832 |
| 6,459,460 B1 | 10/2002 | Yamanaka | |
| 6,661,668 B2 | 12/2003 | Weiblen | |
| 7,193,165 B2 | 3/2007 | Kawanobe et al. | |
| 7,312,785 B2 | 12/2007 | Tsuk et al. | |
| 7,345,671 B2 | 3/2008 | Robbin et al. | |
| 7,456,483 B2 | 11/2008 | Tsukamoto et al. | |
| 7,466,540 B2 | 12/2008 | Takahashi et al. | |
| 8,182,638 B2 | 5/2012 | Weber et al. | |
| 2006/0026535 A1 | 2/2006 | Hotelling et al. | |
| 2006/0026536 A1 | 2/2006 | Hotelling et al. | |
| 2006/0028454 A1 | 2/2006 | Branton et al. | |
| 2009/0283201 A1 | 11/2009 | Black et al. | |

OTHER PUBLICATIONS

Restriction Requirement for U.S. Appl. No. 11/519,285, mailed Nov. 5, 2008.
Office Action for U.S. Appl. No. 11/519,285, mailed Feb. 4, 2009.
Final Office Action for U.S. Appl. No. 11/519,285, mailed Jul. 2, 2009.
Office Action for U.S. Appl. No. 11/519,285, mailed Oct. 28, 2009.
Final Office Action for U.S. Appl. No. 11/519,285, mailed Apr. 21, 2010.

* cited by examiner

*Primary Examiner* — Linda L Gray

(57) ABSTRACT

A media player comprising a display screen is provided. The media player can include a housing having an opening and an area of reduced thickness around the opening. The media player can also include a transparent wall having a flange. Alternatively, the transparent wall may not require a flange but rather can be a flat, substantially transparent piece of material such as plexiglass or glass. The flange can be adhered to a surface of the area of reduced thickness in order to form a transparent protective cover for the display screen.

22 Claims, 14 Drawing Sheets

MEDIA PLAYER WITH MACHINED WINDOW UNDERCUT AND TRANSPARENT WALL DISPOSED THEREIN

CROSS-REFERENCE TO RELATED APPLICATION

This application is a continuation of U.S. patent application Ser. No. 12/840,998, filed Jul. 21, 2010, which is a divisional of U.S. patent application Ser. No. 11/519,285, filed Sep. 11, 2006 and later abandoned, which are hereby incorporated by reference herein in its their entirety.

BACKGROUND OF THE INVENTION

This invention can relate to methods that improve construction of electronic devices. More specifically, this invention can relate to improving the efficiency of an electronic device stored in a closed-back housing.

As products compete to be thinner and thinner, it is important to be as space efficient as possible both to make room for other components as well as to improve and ease the assembly process as much as possible.

In conventional closed-back products, the window normally sits flat on the interior of the housing surface, so no space is saved. More specifically, the window flange simply sits on top of the housing's inner surface.

Therefore, it would be desirable to increase the volume available for storing components in an electronic device without increasing the device size.

It would also be desirable to increase the volume available for components in a closed-back electronic device.

It would be yet further desirable to increase the volume available for storing electronic components in an electronic device while substantially maintaining the structural integrity of the device and attendant level of protection provided to the components.

SUMMARY OF THE INVENTION

A trend exists in the computer industry to reduce size, weight and thickness of electronic devices. Typically, any computer part that can be made smaller is made smaller to accommodate this trend. By way of example, the wall thickness of the computer housing has been made thinner over the years. In most instances, decreased wall thickness reduces the overall thickness and weight of the computer, both of which are desired to make a portable computer more portable.

Nevertheless, making the outer structure thinner to reduce computer weight and thickness has its drawbacks. As a general rule, thicker walls mean stronger walls. Thus, as the walls are thinned, the enclosure becomes more flexible. Consequently, the thinner outer structure can not offer enough support to protect the internal components of the computer. Even when the thinner outer structure is strong enough to protect the internal components, users who have come to expect rigid structures can be unsatisfied.

Moreover, recently, computer housing designs have been implemented in more complex shapes. These complex designs can create structural problems that result in even more flexible outer shells. The complex shapes can be contoured or curvilinear, which generally reduces the overall strength of the computer housing. The complex shapes also make it increasingly difficult to provide any internal support to offset these problems.

One embodiment of the invention may be directed to reducing the thickness in the housing in a region surrounding an opening through which a display screen may be viewed. Normally, this display screen is protected by a transparent wall. The transparent wall typically is adhered to the interior surface of the housing around the opening. In one embodiment of the invention, the housing around the opening is reduced in thickness so a flange of the wall can be placed in the housing. In this embodiment the transparent wall may be flush with the interior surface of the housing. In one embodiment of the invention, the transparent wall may be flush with the exterior surface of the housing as well.

One purpose of the machined window undercut feature according to the invention is to maximize the space available for the electronics in the z-axis without sacrificing the strength of the housing. In fact the machined window undercut may, in certain embodiments, enhance the strength of the design.

Furthermore, the undercut feature can allow for a higher capacity (thicker) battery and taller components on the main logic board. The extra space can also make assembly of the electronics into the housing simpler and more efficient. Such space is especially important in selected models of the iPod™ device manufactured by Apple Computer, Inc. of Cupertino, Calif. This is because all the components can be installed through the top (or bottom) of the product in this closed-back device and more space in along the z-axis—i.e., the axis that runs vertically, toward the viewer, when the viewer looks into the screen of the device—maybe necessary.

The undercut window feature according to the invention can be created by machining a recess in the area where the window will mate with the inside of the housing. Because this product has a closed-back cosmetic housing, a special cutter may be needed to create this recess feature.

In one embodiment of the invention, the housing for the device is extruded aluminum. The recess for the window can be cut just deep enough to allow the housing to maintain its minimum wall thickness—i.e., the wall thickness necessary to maintain the structural integrity of the device and to sufficiently protect the internal components—in that area. The window can then be adhered to the housing in this recess, thereby saving space along the z-axis.

Furthermore, one embodiment of the present invention can facilitate manufacturing electronic devices having certain housing designs such as closed backs. While conventional close-back device may present manufacturing issues, the housing of the electronic device may help to alleviate these issues, as described above, by allowing more space in the z-axis.

A media player comprising a display screen is also provided. The media player can include a housing having an opening and an area of reduced thickness around the opening. The media player can also include a transparent wall having a flange. Alternatively, the transparent wall may not require a flange but rather can be a flat, substantially transparent piece of material. The flange can be adhered to a surface of the area of reduced thickness in order to form a transparent protective cover for the display screen. In another embodiment of the invention, a method is provided. The method can include forming a transparent wall having a stepped edge for placing in an opening of a media player. The method can also include adhering an adhesive to at least one surface of the stepped edge of the transparent wall and using the cutting tool to cut away a portion of the underside of a housing that surrounds an opening in a media player. The method can also include adhering the transparent wall to the housing the adhesive.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE DISCLOSURE

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art that the present invention can be practiced without some or all of these specific details. In other instances, well known process steps have not been described in detail in order not to unnecessarily obscure the description of the present invention.

Figure 1:
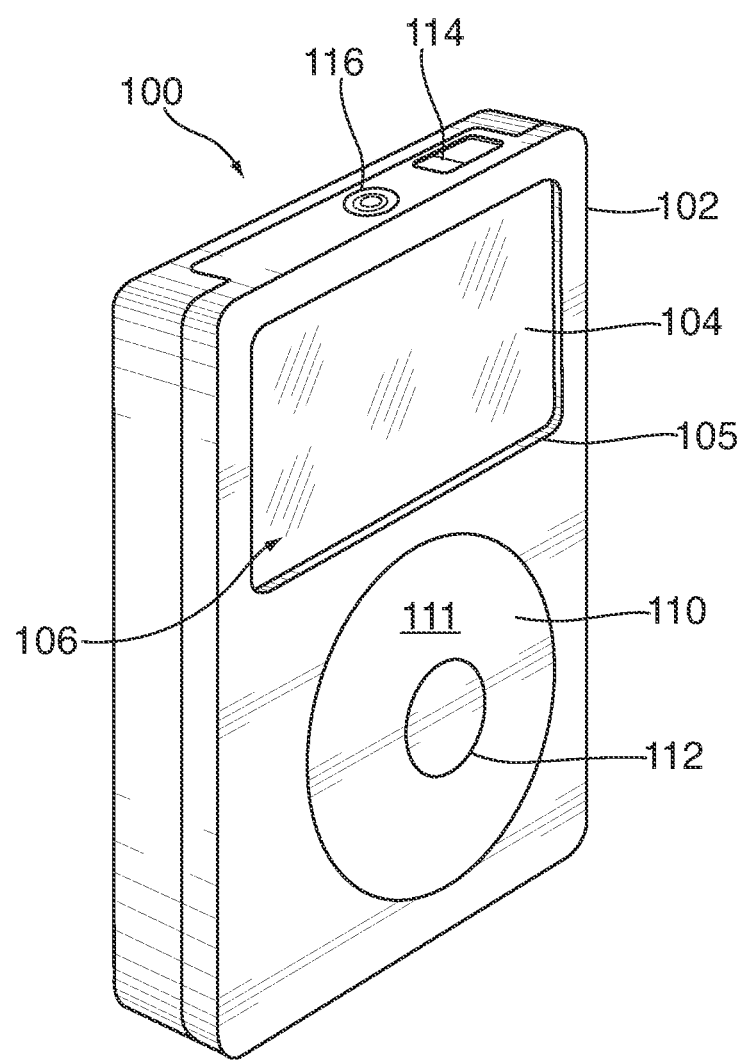
FIG. 1 is a perspective view of a media player that may be designed in accordance with one embodiment of the present invention.

FIG. 1 is a perspective diagram of a media player 100, in accordance with one embodiment of the present invention. The term "media player" generally refers to computing devices that are dedicated to processing media such as audio, video or other images, as for example, music players, game players, video players, video recorders, cameras, and the like. In some cases, the media players contain single functionality (e.g., a media player dedicated to playing music) and in other cases the media players contain multiple functionality (e.g., a media player that plays music, displays video, stores pictures and the like). In either case, these devices are generally portable so as to allow a user to listen to music, play games or video, record video or take pictures wherever the user travels.

In one embodiment, the media player can be a handheld device that is sized for placement into a pocket of the user. By being pocket sized, the user does not have to directly carry the device and therefore the device can be taken almost anywhere the user travels (e.g., the user is not limited by carrying a large, bulky and often heavy device, as in a laptop or notebook computer). For example, in the case of a music player, a user can use the device while working out at the gym. In case of a camera, a user can use the device while mountain climbing. In the case of a game player, the user can use the device while traveling in a car. Furthermore, the device can be operated by the users' hands; no reference surface such as a desktop is needed. In the illustrated embodiment, the media player 100 is a pocket sized hand held MP3 music player that allows a user to store a large collection of music. Although used primarily for storing and playing music, the MP3 music player shown herein can also include additional functionality such as storing a calendar and phone lists, storing and playing games, storing photos and the like. In fact, in some cases, it can act as a highly transportable storage device.

Electronic device 10 can also be any miniature consumer electronic device. Miniature electronic devices may have a form factor that is smaller than that of hand-held devices. Illustrative miniature electronic devices can include, but are not limited to, watches, rings, necklaces, belts, accessories for belts, headsets, accessories for shoes, virtual reality devices, other wearable electronics, accessories for sporting equipment, accessories for fitness equipment, or combinations thereof.

By way of example, the MP3 music player can correspond to the iPod™ MP3 player manufactured by Apple Computer of Cupertino, Calif. One pocket-sized IPod™ has a width of about 2.4 inches, a height of about 4 inches and depths ranging from about 0.72 to about 0.84 inches.

As shown in FIG. 1, media player 100 FIG. 1 also shows housing 102, display screen 104, scroll wheel 110, concave-faced upper non-plastic portion of center button 112, that can be used for user navigation through a user interface, hold-switch 114, and earphone jack 116 of media player. Housing 102 can host center button 112, and can in fact be configured to retain scroll wheel 110 in its position in the media player. Navigation can be implemented in the form of transmission of user instructions in response to user stimulus on scroll wheel 110.

In addition, housing 102 can also define the shape or form of the media player. That is, the contour of housing 102 can embody the outward physical appearance of media player 100. The integrated circuit chips and other circuitry contained within the housing can include a microprocessor (e.g., CPU), memory (e.g., ROM, RAM), a power supply (e.g., battery), a circuit board, a hard drive, other memory (e.g., flash) and/or various input/output (I/O) support circuitry. The electrical components can also include components for inputting or outputting music or sound such as a microphone, amplifier and a digital signal processor (DSP). The electrical components can also include components for capturing images such as image sensors (e.g., charge coupled device (CCD) or complimentary oxide semiconductor (CMOS)) or optics (e.g., lenses, splitters, filters). The electrical components can also include components for sending and receiving media (e.g., antenna, receiver, transmitter, transceiver, etc.).

In the illustrated embodiment shown in FIG. 1, the media player 100 includes display screen 104 and related circuitry.

Display screen 104 is used to display a graphical user interface as well as other information to the user (e.g., text, objects, graphics). By way of example, display screen 104 can be a liquid crystal display (LCD). As shown, display screen 104 is visible to a user of media player 100 through an opening 105 in housing 102, and through transparent wall 106 (alternatively referred to herein as "a window") that is disposed in front of opening 105. Although generally transparent, transparent wall 106 can form part of the housing 102 because it helps to define the shape or form of media player 100 and, in some embodiments of the invention, can form a substantially contiguous surface of the media player together with housing 102.

As mentioned above, media player 100 also includes scroll wheel 110. Scroll wheel 110 generally consists of touchable outer surface 111 for receiving a finger for manipulation on scroll wheel 110.

The position of display screen 104 and scroll wheel 110 relative to housing 102 can be widely varied. For example, they can be placed at any external surface (e.g., top, side, front, or back) of housing 102 that is accessible to a user during manipulation of media player 100. In the illustrated embodiment, scroll wheel 110 is located in a lower, front area of housing 102. Furthermore, transparent wall 106 can be recessed below, level with, or extend above the surface of housing 102. In the illustrated embodiment, transparent wall 106 is substantially flush with the external surface of housing 102.

The shape of display screen 104 and transparent wall 106 can also be widely varied. For example, they can be circular, rectangular, triangular, and the like. In general, the outer perimeter of the shaped scroll wheel defines the working boundary of the scroll wheel. In the illustrated embodiment shown in FIG. 1, display screen 104 is rectangular and scroll wheel 110 is circular.

In addition, media player 100 can also include one or more buttons 112 configured to provide one or more dedicated control functions, such as for making selections or issuing commands associated with operating media player 100. Media player 100 can also include hold switch 114. Media player can also include headphone jack 116 and a data port (not shown).

Figure 2:
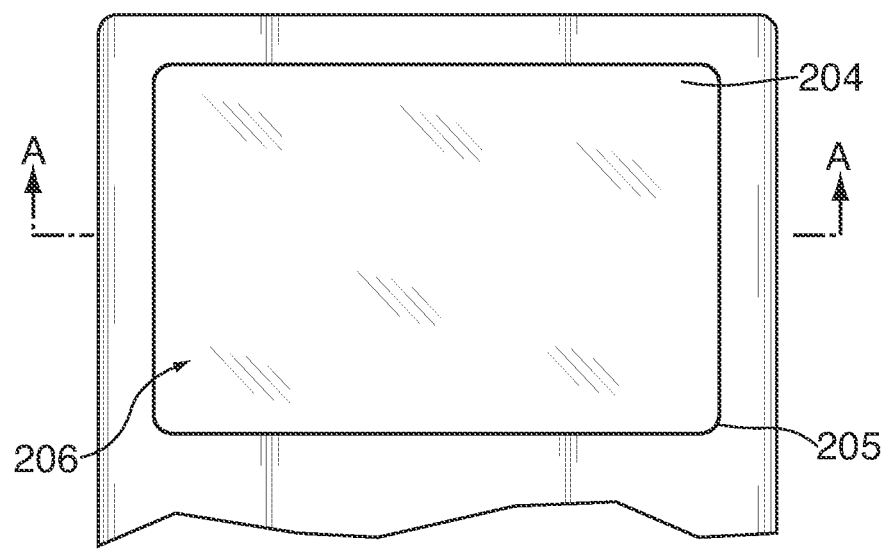
FIG. 2 is a top plan view of the screen portion of a media player in accordance with one embodiment of the invention.

FIG. 2 shows a top plan view of display screen 204 of media player 100 (shown in FIG. 1) in accordance with one embodiment of the invention. FIG. 2 shows screen 204 following assembly of the media player. The following figures showing internal views of the media player either during assembly of the media player according to the invention or following assembly of the media player according to the invention. FIG. 2 also shows opening 205 as well as transparent wall 206.

As noted above with respect to FIG. 1, display screen 204 is visible to a user of media player 100 through opening 205 in housing 102, and through transparent wall 206 that is disposed in front of opening 205. Although transparent, transparent wall 206 can be considered part of housing 102 because it helps to define the shape or form of media player 100. In fact, as described above, display screen 204, can be implemented flush with housing 102 which may provide advantages such to prevent the collection of dirt and/or dust in media player 100 and to prevent media player 100 from catching on to other surfaces.

Figure 3:
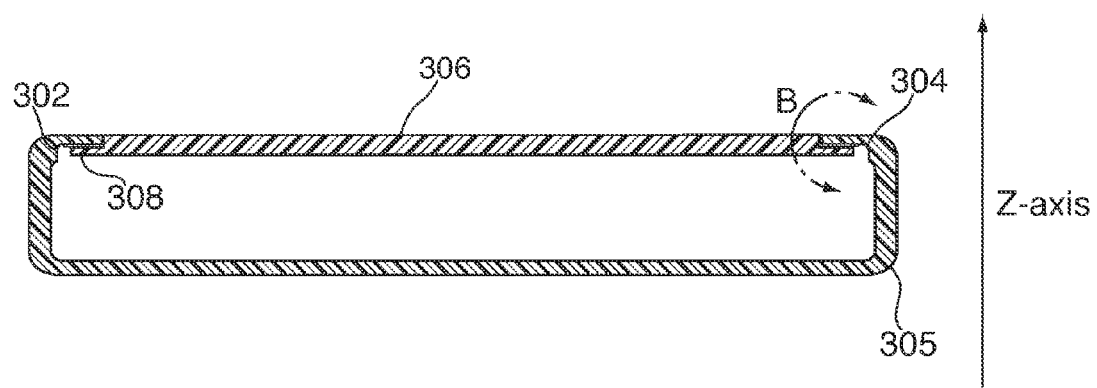
FIG. 3 is cross-sectional taken from line A-A of FIG. 1 in accordance with one embodiment of the invention.

FIG. 3 shows a cross-sectional taken from line A-A of FIG. 2 in accordance with one embodiment of the invention. FIG. 3 shows undercut areas 302 and 304 in housing 305.

FIG. 3 also shows transparent wall 306. FIG. 3 also shows flange 308 of transparent wall 306. In an embodiment of the invention, undercut areas 302 and 304 are adapted to allow flange 308 to rest against undercut areas and to be adhered thereto. In conventional media players, transparent wall would rest on the housing without the undercut areas. This arrangement would take all the space of the thickness of the window away from the inner space in the housing. Thus, the space available for inner electronic components and other components along the z-axis of the media player was reduced. However, in a structure according to the invention as shown in FIG. 4, available volume along the z-axis is increased.

It should be noted that if transparent wall 306 is implemented without a flange—i.e., as a flat piece of transparent material—then surface of media player will no longer be flush in the embodiment shown in FIG. 3 but rather can dip in at transparent wall until the point at which the cutout portion allows transparent wall 306 to abut.

Figure 4:
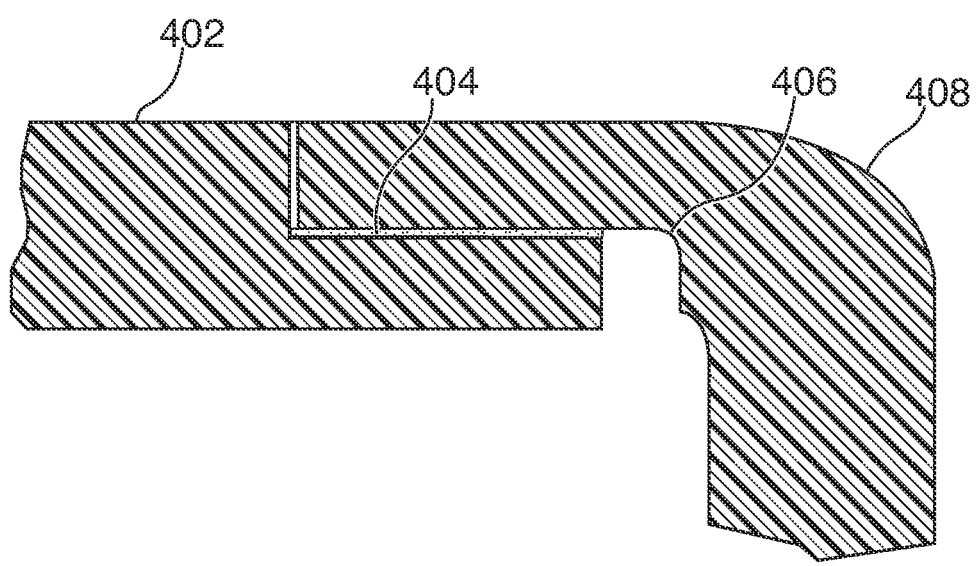
FIG. 4 is an exploded portion taken from line B-B of the cross-sectional shown in FIG. 3 in accordance with one embodiment of the invention.

FIG. 4 shows an exploded portion taken from line B-B of the cross-sectional shown in FIG. 3 in accordance with one embodiment of the invention. FIG. 4 shows transparent wall 402. Wall 402 can incorporate a step so as to mate with undercut 406. FIG. 4 also shows adhesive 404 for adhering wall 402 to housing 408.

Undercut 406 allows wall 402 to sit higher in housing 408. This relationship makes more room for internal components.

This relationship also improves ease of assembly in closed-back devices such as iPod™ media players. This relationship improves ease of assembly because closed-back devices can typically only be assembled from the top, the bottom or the opening in the face of the housing. As described above, the closed-back of a device typically limits the access to the internal components once they have been inserted in the device. This can make assembly of the device more challenging.

Figure 5:
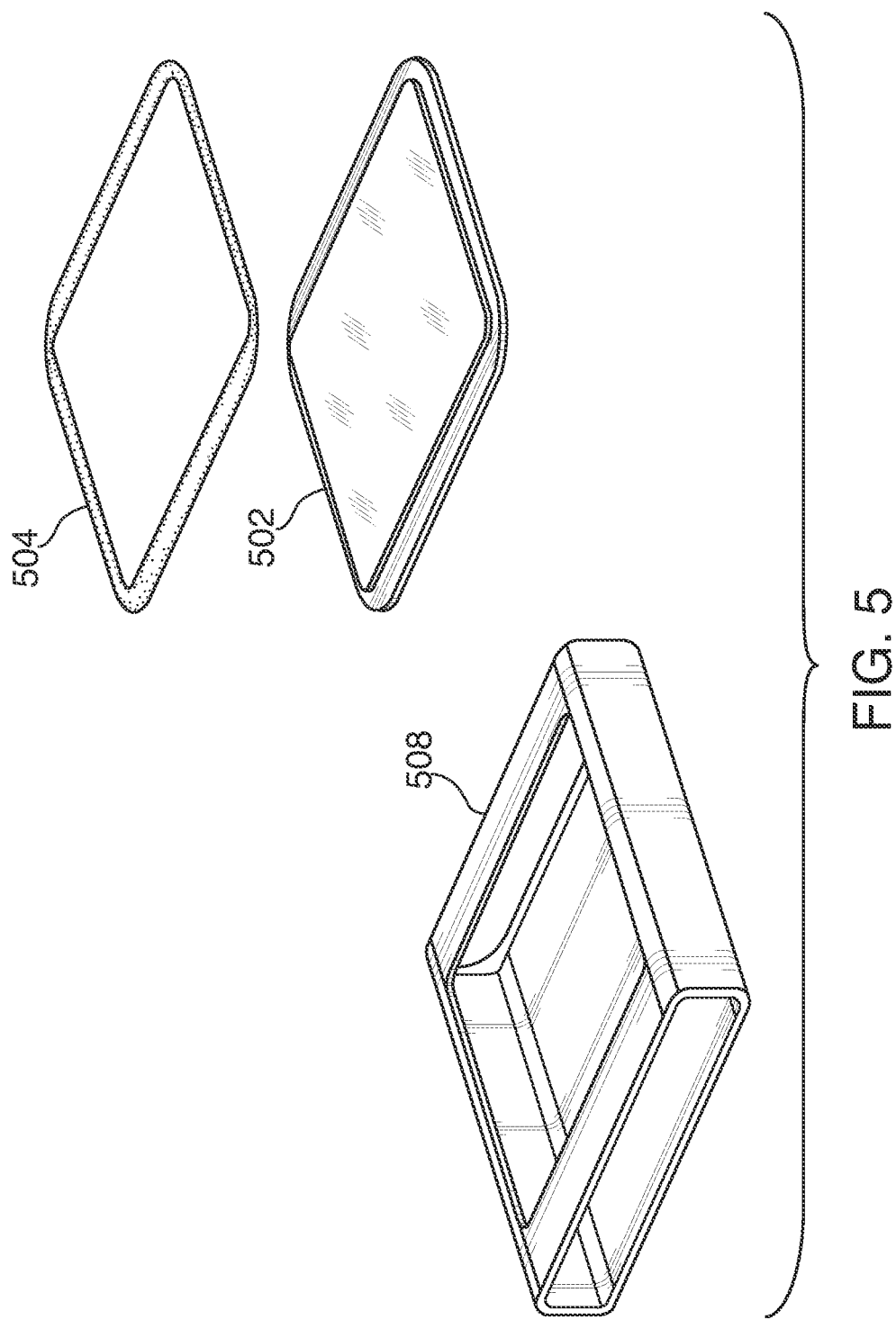
FIG. 5 is a perspective view of a media player window and portion of a media player in accordance with one embodiment of the invention.

FIG. 5 shows a perspective view of a media player window and portion of a media player according to the invention. FIG. 5 shows housing 508, transparent wall 502 and adhesive 504. Alternative configurations of adhesive 504 are described in more detail in FIG. 8 below.

Figure 6:
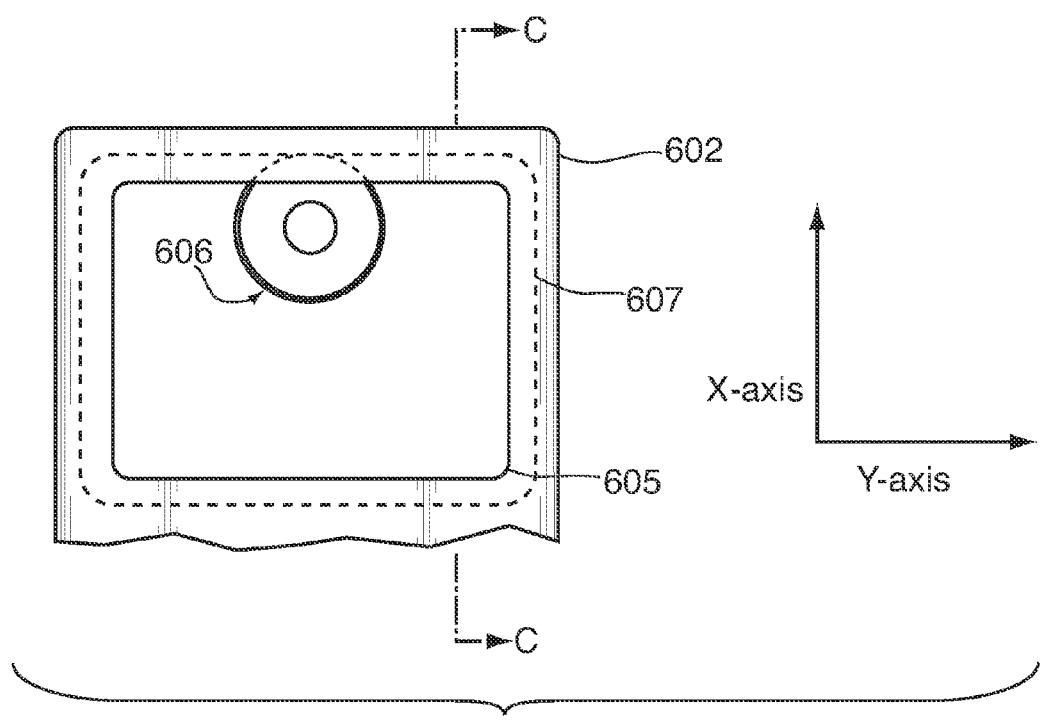
FIG. 6 is a top plan view of a media player housing and special cutter in accordance with one embodiment of the invention.

FIG. 6 illustrates a top plan view of a media player housing and special cutter according to the invention. FIG. 6 shows opening 605 in housing 602, customize cutter 606 for cutting undercut 607 into the underside of housing 602. Undercut 607 is shown in dotted line because it is not visible from a top plan view of the outside of housing 602.

It should be noted that the dimension in the x and y axes of undercut 607 can be determined by the radius of cutter 606. This is because, in one embodiment of a method according to the invention, cutter 606 can be lowered through opening 605 and then used to cut undercut 607 into the underside of the top surface of housing 602. Furthermore, the sharpness of the corners of undercut 607 will also be determined by the radius of cutter 606. Thus a mathematical relationship is obtained between the radius of the corners of undercut 607 and the radius of cutter 606 to produce relatively smooth corners as illustrated in FIG. 6.

The mathematical relationship may include the width of the undercut required to present a sufficient surface onto which the transparent wall flange can be adhered, the radius of the cutting head in order to allow the cutting ahead to reach the required width in the undercut while the shaft of the cutting tool does not interfere with the ledge of the opening, and the radius of the shaft.

Figure 7:
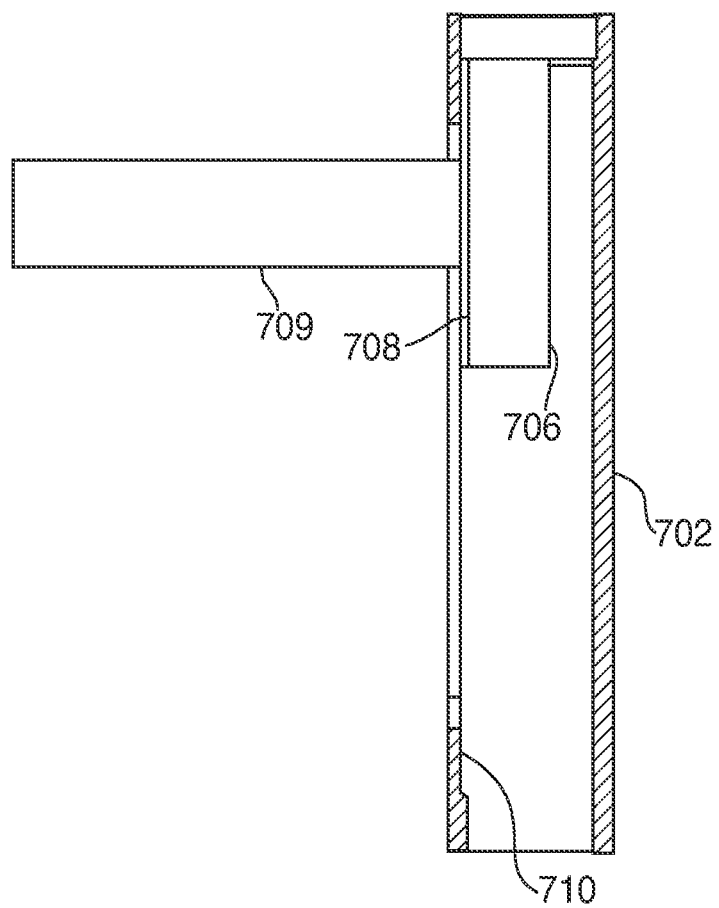
FIG. 7 is a side plan view taken from line C-C of a media player housing and special cutter in accordance with one embodiment of the invention.

FIG. 7 shows a side plan view taken from line C-C of FIG. 6 of a media player housing 702 and customized cutter 706 according to the invention. Cutter 706 comprises cutter shaft 709 and cutter head 708. FIG. 7 also shows cut out portion 710 of an undercut according to the invention. Thus, FIG. 7 shows one side of an undercut according to the invention.

Figure 8:
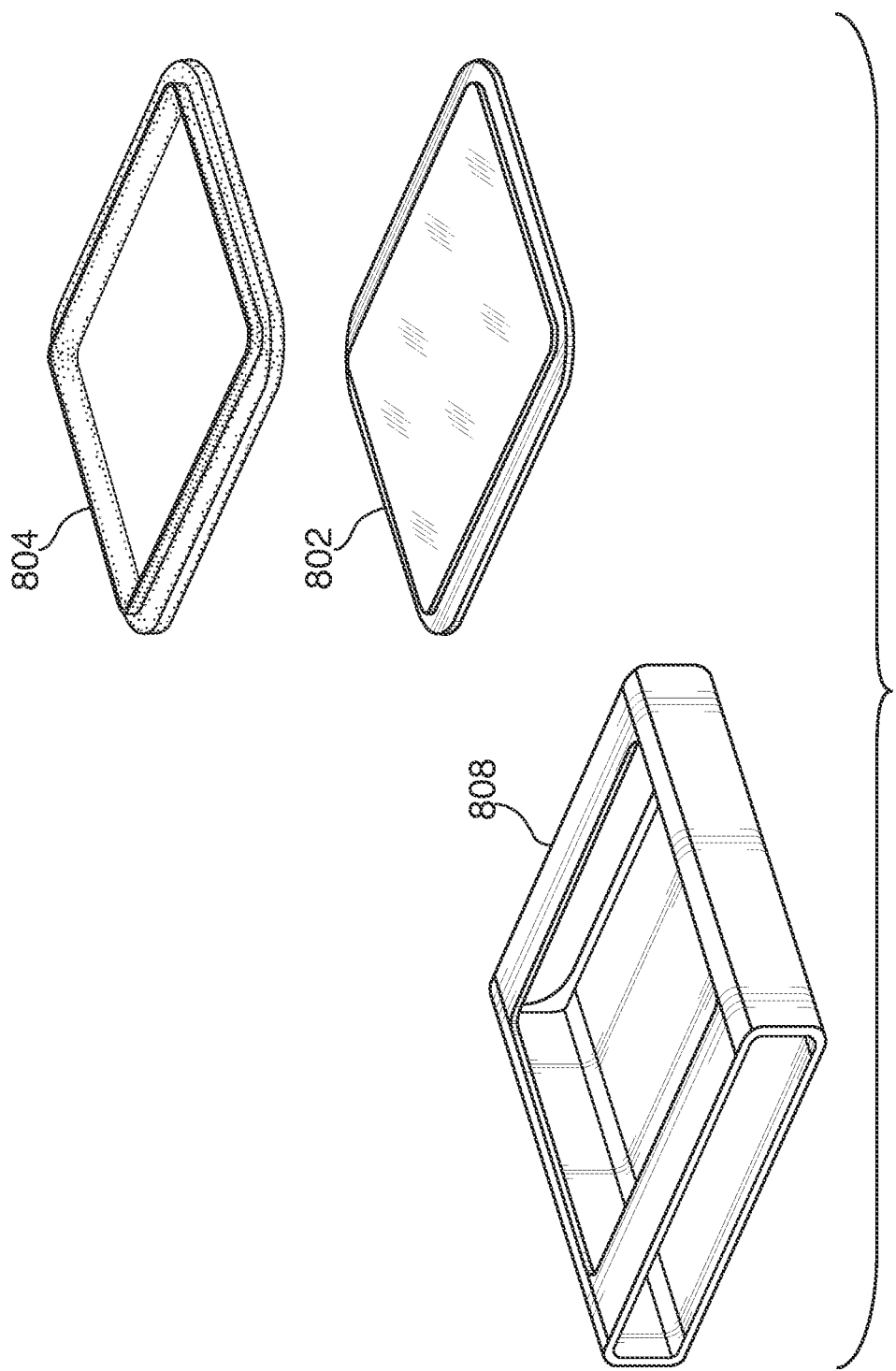
FIG. 8 is another perspective view of a media player window and portion of a media player in accordance with one embodiment of the invention.

FIG. 8 shows an exploded portion similar to FIG. 5. All the elements of FIG. 8 are the same as in FIG. 5 with the single difference being the shape and orientation of adhesive 804. In FIG. 8, adhesive 804 fills the additional cavities between wall 802 and the undercut (not shown in FIG. 8) in housing 808 as well as at least partially the vertical gap (illustrated in FIGS. 3, 4, and 9) between housing 808 and wall 802. This additional adhesive can provide additional structural reinforcement and enhance the strength of the bond between wall 802 and housing 808.

Figure 9:
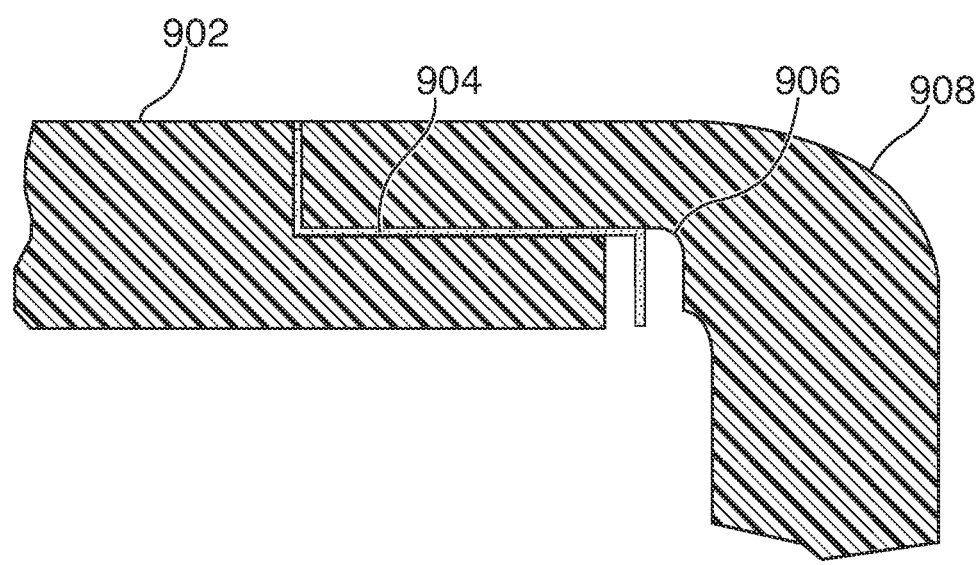
FIG. 9 an exploded portion similar to the exploded portion shown in FIG. 4 in accordance with one embodiment of the invention.

FIG. 9 shows an exploded portion similar to FIG. 4. All the elements of FIG. 9 are the same as in FIG. 4 with the single difference being the shape and orientation of adhesive 904. In FIG. 9, adhesive 904 fills the additional cavities between wall 902 and undercut 906 as well as the additional vertical wall between housing 908 and wall 902. As described above, this additional adhesive can provide additional structural reinforcement and enhance the strength of the bond between wall 902 and housing 908.

In some embodiments of the invention, adhesive 904 can be disposed both above undercut 906 and below undercut 906, as shown in FIG. 9. Alternatively, adhesive 904 may be disposed in either one direction—i.e., above or below undercut 906 but not both above and below undercut 906. Of course, the specific application of adhesive may be dictated based on manufacturing requirements. Other additional applications of adhesives may include applying adhesives as round dots or by other suitable application technique.

Figure 10:
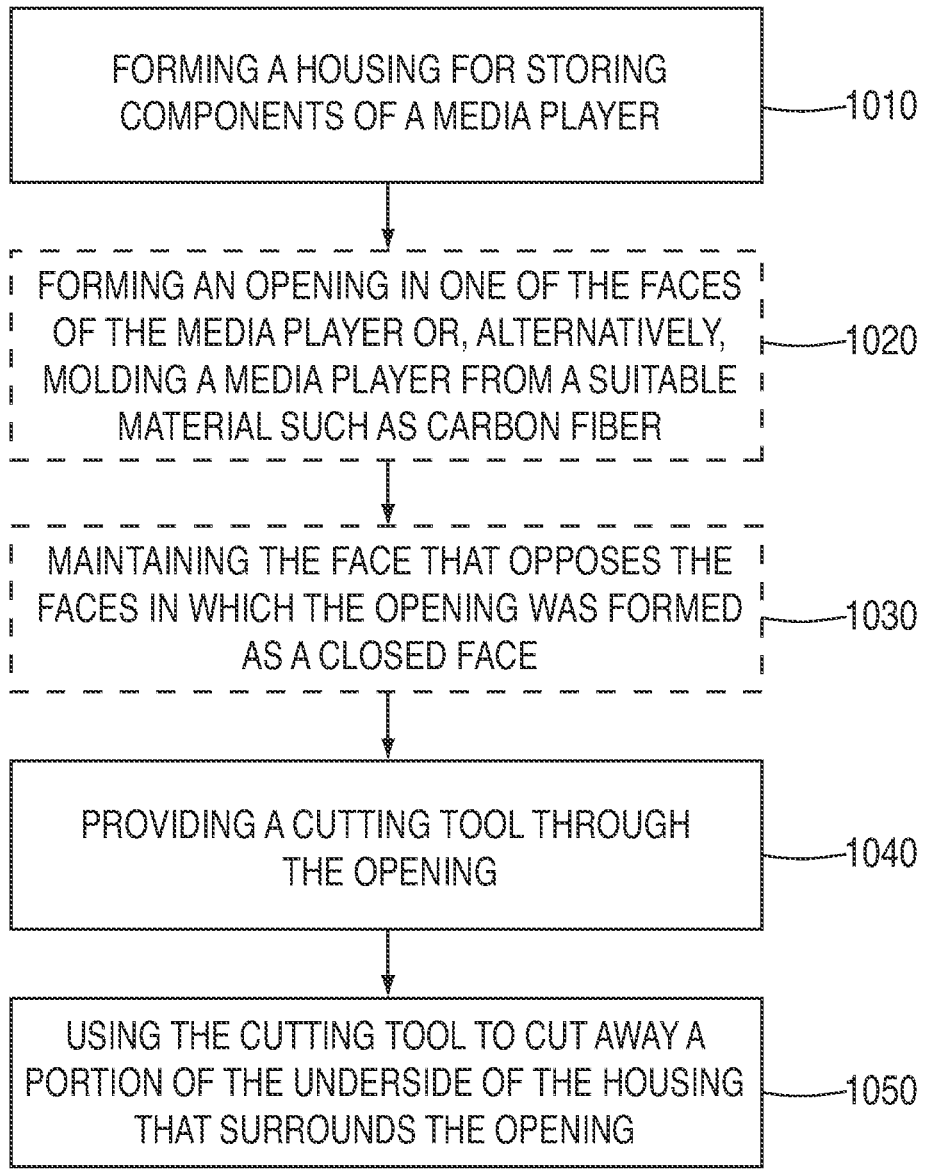
FIG. 10 is a flowchart describing a method in accordance with one embodiment of the invention.

FIG. 10 shows a method according to the invention. Step 1010 shows forming a housing for storing components of a media player. Step 1020 shows forming an opening in one of the faces of the housing or, alternatively, molding a media player having an opening from a suitable material such as carbon fiber. Step 1030 shows the optional step of maintaining the face that opposes the face in which the opening was formed as a closed face. Step 1040 shows providing a cutting tool through the opening that was formed in step 1020. Step 1050 shows using the cutting tool to cut away a portion of the underside of the housing that surrounds the opening. It should be noted that if the media player was molded, the undercut could be provided as part of the molding process.

Figure 11:
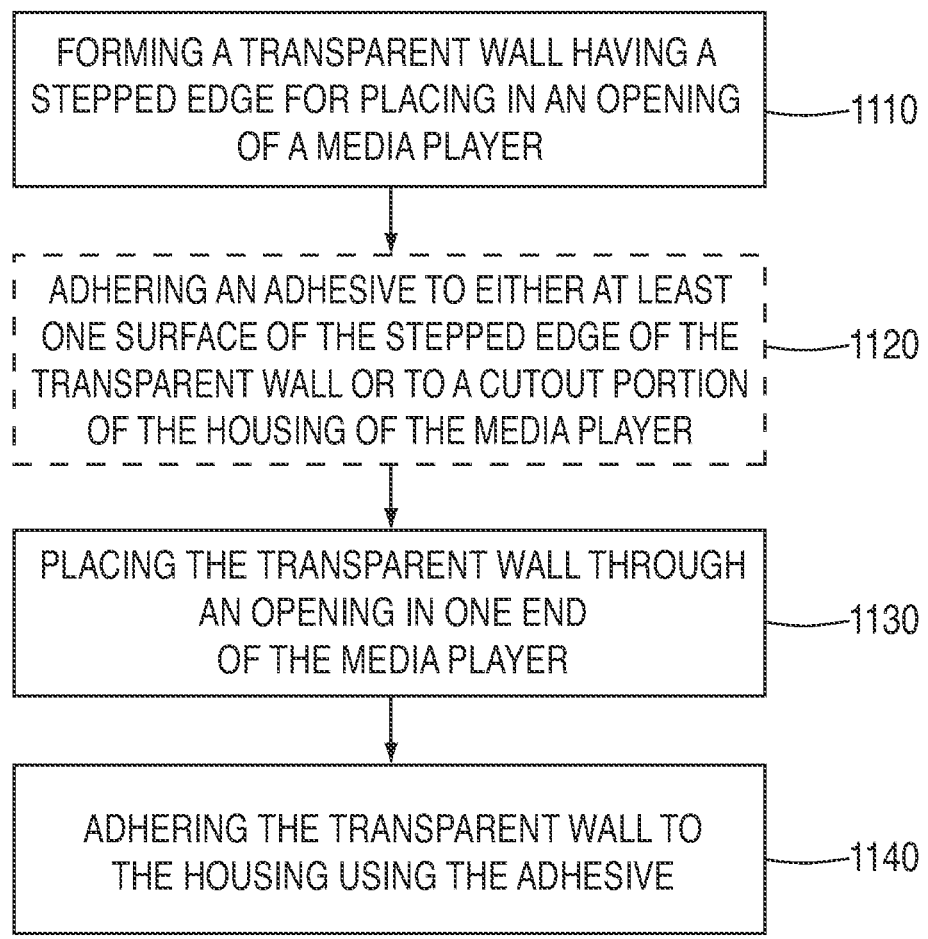
FIG. 11 is a flowchart describing another method in accordance with one embodiment of the invention.

FIG. 11 shows another portion of a method according to the invention. Step 1110 shows forming a transparent wall having a stepped edge for placing in an opening of a media player. FIG. 1120 shows adhering an adhesive to either at least one surface of the stepped edge of the transparent wall or to a cutout portion of the housing of the media player. This step is drawn in dotted line to emphasize that the adhesive could be applied to either the wall or the housing.

Step 1130 shows placing the transparent wall through one end in the housing. Step 1140 shows adhering the transparent wall to one the housing the adhesive.

Figure 12:
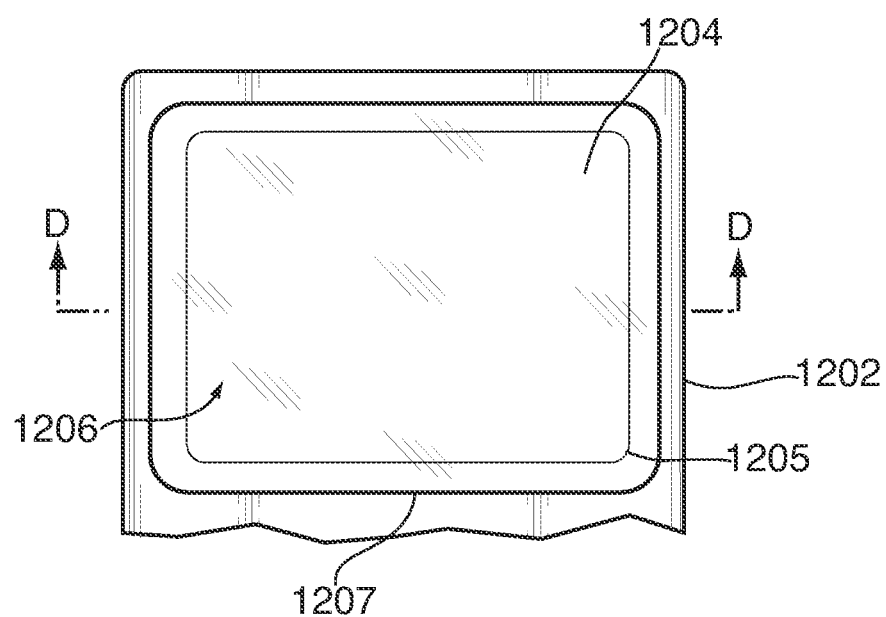
FIG. 12 is a top plan view of the screen portion of a media player in accordance with another embodiment of the invention.

FIG. 12 shows an alternative embodiment of the invention. FIG. 12 shows display screen 1204 as it can be seen through transparent wall 1206. Furthermore, opening 1205 is where screen 1204 can be viewed. However, in the embodiment shown in FIG. 12, overcut 1207 is implemented on the top side of housing 1202 instead of the underside.

With respect to the embodiment shown in FIG. 12, the corners of overcut 1207 can be made to have a substantially smaller radius than the corners of undercut 607 shown in FIG. 6. This can be due to the fact that a cutting tool used to implement overcut 1207 does not require a large radius because it does not have to cut deep within the opening while preserving the edge of the opening as does cutter 606 shown in FIG. 6. Rather, a cutter having a substantially smaller radius can be used because the cutter can be directed to exactly the portion being cut instead of having to reach under the ledge of the opening, as shown and described in more detail in FIG. 6. Thus, a cutter used to implement overcut 1207 can include a radius, or even a diameter, that is smaller than the width of overcut 1207, while cutter 606 may comprise a radius that may be even double the size or more than the width of undercut 607.

It should also be noted that if transparent wall 1206 is implemented without a flange (not shown)—i.e., as a flat piece of transparent material—then surface of media player can present a surface that is flush with housing 1202. Nevertheless, the thickness of wall 1206 will be less and, as such, may not provide the level of protection to a display screen that a thicker transparent wall, implementable by using a flanged, or stepped, transparent wall, may provide.

Figure 13:
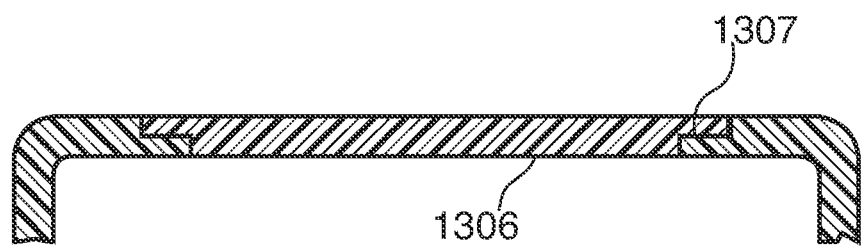
FIG. 13 is a cross-sectional view taken from line D-D of the screen portion in FIG. 12 in accordance with one embodiment of the invention.

FIG. 13 also shows the embodiment shown in FIG. 12. FIG. 13 shows this embodiment from line D-D of FIG. 12. FIG. 13 shows wall 1306 and overcut 1307. In FIG. 13, wall 1306 may be adhered to the housing without having to put wall 1306 into housing. Rather, wall 1306 can be adhered directly onto overcut 1307 with an adhesive similar to any of the embodiments described above with respect to the adhesive being adhered to the undercut as shown, for example, in FIG. 5 and/or FIG. 8.

The methods according to the invention can preferably implemented by a combination of hardware and software, but can also be implemented in hardware or software. The method can also be embodied as computer readable code on a computer readable medium. The computer readable medium is any data storage device that can store data which can thereafter be read by a computer system. Examples of the computer readable medium include read-only memory, random-access memory, hard drive, flash memory, CD-ROMs, DVDs, magnetic tape, optical data storage devices, and carrier waves.

In yet another aspect of the invention, the undercut portion of the housing or the overcut portion of the housing may be implemented wherever another element such as the audio jack 116, the holdswitch 114 (as shown, for example, in FIG. 1) or any other suitable element of the media player is mounted on the housing of the media player. In each of these implementations, methods or structures according to the invention may be used to reduce the internal volume within the media player required to mount the element.

Figure 14:
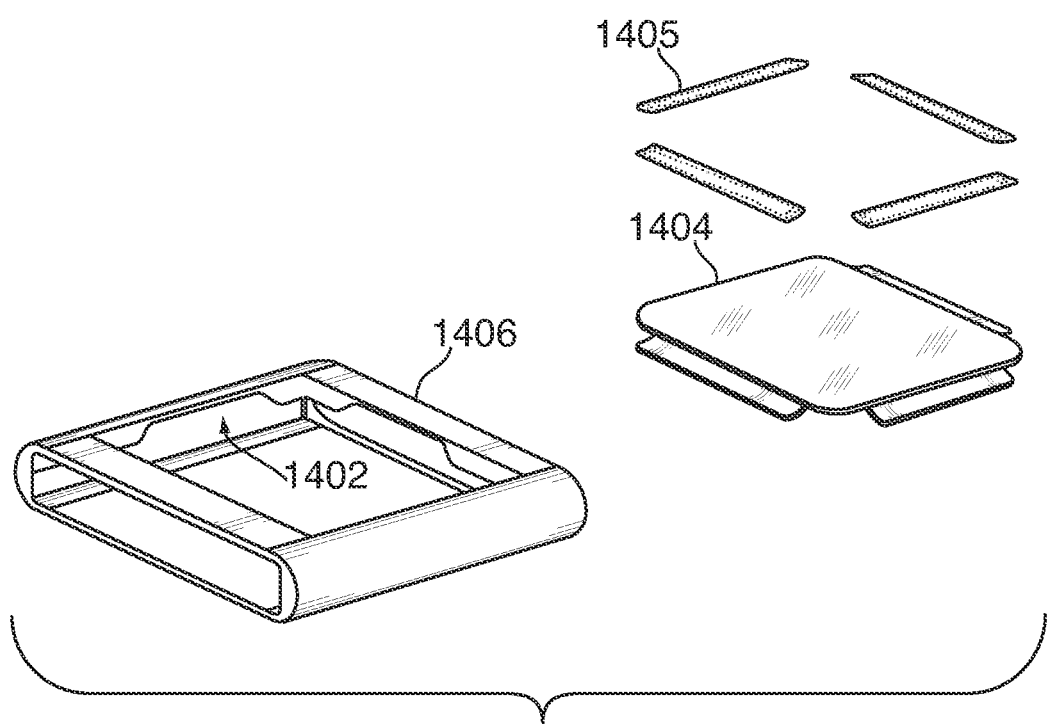
FIG. 14 is a perspective view of a media player window and portion of a media player in accordance with one embodiment of the invention.

In an additional embodiment of the invention, as shown in FIG. 14, portion 1402, or other portions, of the cutout can be left at the original thickness. In order to mate transparent wall 1404 with housing 1406, transparent wall 1404 and adhesive 1405 may be designed accordingly. As shown in FIG. 14, adhesive 1405 may be applied in multiple strips or deposits. The number of strips or deposits of adhesive can depend on the shape and arrangement of the multiple cutouts in housing 1406.

It is therefore intended that the following appended claims be interpreted as including all such alterations, permutations, and equivalents as fall within the true spirit and scope of the present invention. The embodiments described herein-above are further intended to explain the best modes known of practicing the invention and to enable others skilled in the art to utilize the invention in such, or other embodiments and with the various modifications required by the particular applications or uses of the invention.

Accordingly, the description is not intended to limit the invention to the form disclosed herein. Also, it is intended that the appended claims be construed to include alternative embodiments.

What is claimed is:

1. An electronic device comprising:
a transparent wall comprising flanges; and
a housing comprising:
an exterior surface;
an interior surface; and
an opening extending through the exterior surface to the interior surface,
wherein:
the opening defines a third surface between the exterior surface and the interior surface; and
the third surface varies in width around the opening and comprises thin portions;
each of the flanges is configured to mate with a respective portion of the interior surface adjacent to the thin portions; and
each of the flanges is mated with the respective portion of the interior surface with an adhesive,
wherein a vertical gap is formed between an outer side surface of the flanges and the housing.

2. The electronic device of claim 1, wherein the opening comprises four sides.

3. The electronic device of claim 2, wherein each of the four sides comprises at least one thin portion.

4. The electronic device of claim 1, wherein the opening is circular.

5. The electronic device of claim 1, wherein the housing is unitarily formed.

6. The electronic device of claim 1, wherein each of the thin portions is cut out from the interior surface of the housing a cutting tool inserted through the opening.

7. The electronic device of claim 1, wherein the adhesive that mates each of the flanges with the respective portion of the interior surface comprises an adhesive strip.

8. The electronic device of claim 1, wherein the adhesive that mates each of the flanges with the respective portion of the interior surface comprises an adhesive deposit.

9. The electronic device of claim 1, further comprising a display screen disposed adjacent to the transparent wall and viewable through the opening.

10. The electronic device of claim 1, wherein the adhesive is configured to fill additional cavities formed between the flange and the interior surface of the housing.

11. An electronic device comprising:
a transparent wall comprising flanges; and
a housing comprising:
an exterior surface;
an interior surface; and
an opening extending through the exterior surface to the interior surface,
wherein:
the opening defines a third surface between the exterior surface and the interior surface;
the third surface varies in width around the opening to accommodate the flanges; and
each of the flanges is coupled with a respective portion of the interior surface,
wherein a gap is formed between an outer side surface of the flanges and the housing and the housing.

12. The electronic device of claim 11, wherein the transparent wall comprises:
four sides, each of the four sides comprising one of the flanges; and
four corners, wherein the four sides and the four corners collectively form a periphery of the transparent wall.

13. The electronic device of claim 11, wherein each of the flanges is coupled with the respective portion of the interior surface with an adhesive.

14. The electronic device of claim 11, wherein: the housing is a unibody housing; and the variation in the width of the third surface around the opening is formed by a tool inserted through the opening.

15. An electronic device comprising:
a transparent wall comprising flanges; and
a housing comprising:
an opening defined by a surface; and
notches formed in the surface to accept the flanges such that each of the flanges is coupled with a respective portion of the housing,
wherein a gap is formed between an outer side surface of the flanges and the housing and the housing.

16. The electronic device of claim 15, wherein the transparent wall comprises; straight portions; and corners connecting the straight portions, wherein each flange extends from a respective straight portion.

17. The electronic device of claim 16, wherein each of the flanges is mated with a respective portion of an interior surface of the housing with an adhesive, and wherein the adhesive is configured to fill additional gaps formed between the flange and the interior surface of the housing.

18. The electronic device of claim 15, wherein the opening comprises: straight portions; and corners connecting the straight portions, wherein each notch is provided in a respective straight portion.

19. The electronic device of claim 15, wherein the gap is partially filled with adhesive.

20. The electronic device of claim 16, wherein the opening is in the shape of a parallelogram with rounded corners.

21. The electronic device of claim 1, wherein a top surface of the transparent wall is flush with the exterior surface and a bottom surface of the transparent wall is flush with portions of the interior surface.

22. The electronic device of claim 11, wherein a top surface of the transparent wall is flush with the exterior surface and a bottom surface of the transparent wall is flush with portions of the interior surface.

* * * * *